(12) United States Patent
Bhagavatula

(10) Patent No.: US 11,374,583 B1
(45) Date of Patent: Jun. 28, 2022

(54) INJECTION LOCKED RESONATOR-BASED OSCILLATOR

(71) Applicant: Mixed-Signal Devices Inc., Irvine, CA (US)

(72) Inventor: Srikar Bhagavatula, Irvine, CA (US)

(73) Assignee: Mixed-Signal Devices Inc., Irvine, CA (US)

( * ) Notice: Subject to any disclaimer, the term of this patent is extended or adjusted under 35 U.S.C. 154(b) by 0 days.

(21) Appl. No.: 17/403,124

(22) Filed: Aug. 16, 2021

Related U.S. Application Data

(60) Provisional application No. 63/066,006, filed on Aug. 14, 2020.

(51) Int. Cl.
*H03L 7/099* (2006.01)
*H03L 7/081* (2006.01)
*H03B 5/36* (2006.01)

(52) U.S. Cl.
CPC .............. *H03L 7/099* (2013.01); *H03B 5/36* (2013.01); *H03L 7/0812* (2013.01)

(58) Field of Classification Search
CPC .......... H03B 5/36; H03L 7/0812; H03L 7/099
USPC ........ 331/57, 1 A, 18, 46, 47, 158; 327/141, 327/147, 153
See application file for complete search history.

(56) References Cited

U.S. PATENT DOCUMENTS 9,331,878 B2 * 5/2016 Cheng .................. H04L 27/156
2010/0277207 A1 11/2010 Mahdavi

* cited by examiner

*Primary Examiner* — Arnold M Kinkead
(74) *Attorney, Agent, or Firm* — KPPB LLP

(57) ABSTRACT

Injection locked resonator-based oscillators in accordance with various embodiments of the invention are described. An embodiment includes an injection locked resonator-based oscillator, that includes: an amplifier, a feedback circuit, a delayed locked loop (DLL), an off-chip high-frequency resonator that generates a resonance frequency, a switch connected to a power source $V_{dd}$, and a voltage-controlled oscillator (VCO), where an input to the amplifier is connected to both the high-frequency resonator and the DLL to lock a signal, where an output from the amplifier is connected to the feedback circuit that is provided back to the high-frequency resonator.

20 Claims, 5 Drawing Sheets

INJECTION LOCKED RESONATOR-BASED OSCILLATOR

CROSS REFERENCE TO RELATED APPLICATIONS

This application claims priority to U.S. Provisional Application Ser. No. 63/066,006 entitled "Injection Locked Resonator-Based Oscillator" to Bhagavatula, filed Aug. 14, 2020, the disclosure of which is herein incorporated by reference in its entirety.

FIELD OF THE INVENTION

The present invention generally relates to field of oscillators and, more specifically, to injection locked resonator-based oscillators.

BACKGROUND

Clock oscillators are employed widely in analog, mixed-signal and radio frequency (RF) applications. Integrated circuits (IC) can utilize clock oscillators in their internal operations. Accurate clock oscillators can use crystal and/or acoustic wave resonators in order to generate a stable clock. Thin film bulk acoustic wave resonators can also be employed as an external component to an IC to generate accurate clocks.

Resonators are used in many reference circuits within integrated circuits (IC) to produce an accurate clock. These reference circuits can employ an off-chip resonator with a high quality (high-Q) factor. Accurate reference circuits may use crystal and/or acoustic wave resonators in order to generate a stable clock.

A resonator is a device that can exhibit resonant behavior. That is, it naturally can oscillate with greater amplitude at some frequencies than at other frequencies. Resonators can be used to generate specific frequencies. High-Q factor resonators have low damping, so they can resonate for a longer time.

BRIEF SUMMARY OF THE INVENTION

Systems and methods for injection resonator-based oscillators are described. An embodiment includes an injection locked resonator-based oscillator, that includes: an amplifier with an input terminal and an output terminal, a feedback circuit that includes an input terminal and an output terminal, a sub-circuit that includes a first input terminal, a second output terminal and a third terminal; an off-chip high-frequency resonator having a first output terminal that generates a resonance frequency and a second input terminal; a switch connected to a power source $V_{dd}$; and a voltage-controlled oscillator (VCO); where the input terminal of the amplifier is connected to the first output terminal of the high-frequency resonator and the second output terminal of the sub-circuit; where the output terminal of the amplifier is connected to the input terminal of the feedback circuit; where the output terminal of the feedback circuit is connected to the second input terminal of the high-frequency resonator; where the first input terminal of the sub-circuit is connected to the VCO; and where the third terminal of the sub-circuit is connected to the switch.

In a further embodiment, the sub-circuit is a delay locked loop (DLL).

In still a further embodiment, the sub-circuit is a buffer circuit.

In still a further embodiment, an output signal output by the second output terminal of the sub-circuit is injected with the resonance frequency output by the first output terminal of the high-frequency resonator to lock a frequency of the output signal that is output by the output terminal of the amplifier.

In still a further embodiment again, the switch turns the sub-circuit off when the output signal that is output by the output terminal of the amplifier reaches a steady state mode of operation and is locked to a frequency.

In yet a further embodiment, the injection locked resonator-based oscillator further includes an off-chip low frequency resonator, wherein an input signal provided to the first input terminal of the sub-circuit is generated by the low-frequency resonator.

In still a further embodiment again, the amplifier is a first amplifier and the feedback circuit is a first feedback circuit, where the injection locked resonator-based oscillator further includes a second amplifier and a second feedback circuit, where the second amplifier and the second feedback circuit lock a frequency of the low-frequency resonator.

In yet a further embodiment, the injection locked resonator-based oscillator further includes an adder, where an output signal from an output terminal of the second amplifier is fed to the adder and an output of the adder is fed to an input terminal of the VCO.

In still a further embodiment again, the VCO uses the frequency of the low-frequency resonator to generate an output clock that is equal to a desired frequency that is fed to the first input terminal of the sub-circuit to generate a locked output signal output by the second output terminal of the sub-circuit.

In yet a further embodiment, the injection locked resonator-based oscillator further includes a divider circuit, where the output signal from the output terminal of the first amplifier is divided through the divider circuit to generate a signal that is compared with the output signal from the output terminal of the second amplifier to form a feedback loop.

Another embodiment of the invention includes a method for injection locking frequency of oscillation, including: generating, using a high frequency resonator that includes a first output terminal and a second input terminal, a resonance frequency signal on the first output terminal and providing it to an input terminal of an amplifier; injecting, using a sub-circuit that includes a first input terminal, a second output terminal, and a third terminal, a signal that is output from the second output terminal of the sub-circuit to the input terminal of the amplifier; generating an output signal on an output terminal of the amplifier and feeding the output signal back to the second input terminal of the high frequency resonator using a feedback circuit; where the first input terminal of the sub-circuit is connected to a voltage-controlled oscillator (VCO) and the third terminal of the sub-circuit is connected to a switch that is connected to a power source $V_{dd}$.

In a further embodiment, the sub-circuit is a delay locked loop (DLL).

In yet a further embodiment, the sub-circuit is a buffer circuit.

In yet a further embodiment again, an output signal output by the second output terminal of the sub-circuit is injected with the resonance frequency output by the first output terminal of the high-frequency resonator to lock a frequency of an output signal that is output by the output terminal of the amplifier.

In still a further embodiment again, the switch turns the sub-circuit off when the output signal that is output by the output terminal of the amplifier reaches a steady state mode of operation and is locked to a frequency.

In still a further embodiment again, the method further includes generating, using a low-frequency resonator, a signal and providing the signal to the first input terminal of the sub-circuit.

In yet a further embodiment, the amplifier is a first amplifier and the feedback circuit is a first feedback circuit, where the method further includes locking a frequency of the low-frequency resonator using a second amplifier and a second feedback circuit.

In still a further embodiment, an output signal from an output terminal of the second amplifier is fed to an adder and an output of the adder is fed to the VCO.

In still a further embodiment again, the VCO uses the frequency of the low-frequency resonator to generate an output clock that is equal to a desired frequency that is fed to the first input terminal of the sub-circuit to generate a locked output signal output by the second output terminal of the sub-circuit, the output signal from the output terminal of the first amplifier is divided through a divider circuit to generate a signal that is compared with the output signal from the output terminal of the second amplifier to form a feedback loop.

DETAILED DESCRIPTION OF THE DRAWINGS

Turning now to the drawings, injection locked resonator-based oscillator in accordance with various embodiments of the invention are illustrated. Many embodiments provide for methods of locking frequency of oscillation in resonators with multiple modes of oscillation. Certain embodiments include systems and methods for injecting a frequency close to a desired mode of resonance, which can provide for improved and lower power consumption. In several embodiments, the systems and methods can obtain high quality oscillation signal using low quality oscillation source as a reference.

In many embodiments, an injection locked resonator-based oscillator can employ an on-chip voltage-controlled oscillator (VCO) and a phase locked loop (PLL) to produce a signal which can force a high-Q factor resonator to operate at a frequency equal to a desired frequency of operation. The PLL can use an external low frequency crystal for its reference. In several embodiments, a frequency locked loop (FLL) can be utilized instead of a PLL in order to generate a clock frequency which forces the high-Q factor resonator to operate at a frequency equal to a desired frequency of operation. In numerous embodiments, a delay locked loop (DLL) and a buffer circuit can be utilized in an injection locked resonator, where the DLL and/or buffer can be turned off once the oscillation of the injection locked resonator-based oscillator has been locked to a desired frequency. In this way power can be saved.

In certain embodiments, an injection locked resonator-based oscillator can employ an on-chip VCO, a PLL and a divider to produce a clock frequency which can force a high-Q factor resonator to operate at a frequency equal to a desired frequency of operation. This can be accomplished by dividing an output frequency of the injection locked resonator-based oscillator and by feeding it back to the VCO in order to tune the VCO. In numerous embodiments, use of injection locked resonator-based oscillators can eliminate a need for special resonators with voltage sensitivity, which can reduce overall system costs. In various embodiments, a secondary low performance loop can be employed which can force the high-Q resonator to operate at a desired frequency. In this way, the low power and low area overhead of the secondary loop may not degrade the performance of the high-Q resonator.

Various injection locked resonator-based oscillators and their applications in accordance with certain embodiments of the invention are discussed further below.

Injection Locked Resonator-Based Oscillators

Figure 1:
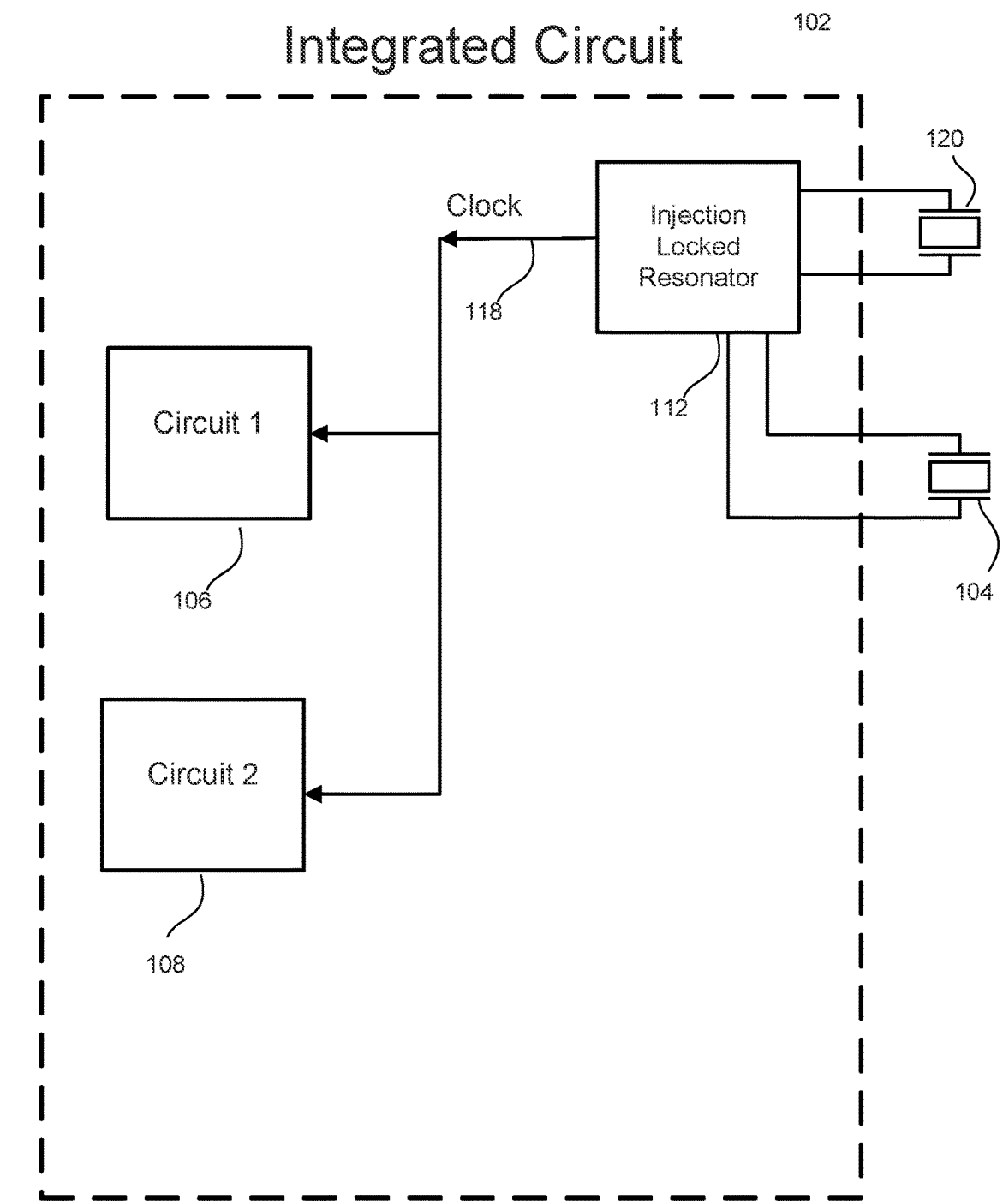
FIG. 1 conceptually illustrates an injection locked resonator within an IC where an injection locked resonator-based oscillator can provide a clock to various circuits within the IC accordance with an embodiment of the invention.

In many embodiments, injection locked resonator-based oscillators can be utilized within an IC to provide an accurate clock to various circuits within the IC. A circuit diagram of an IC 100 in accordance with an embodiment of the invention is illustrated in FIG. 1. In the illustrated embodiment, an injection locked resonator-based oscillator 112 can employ an external low frequency crystal 120, and a high frequency resonator 104, to produce a clock signal 118, which can be utilized by various circuits (106, 108) within the IC 100.

Although various injection locked resonator-based oscillators are described above with reference to FIG. 1, any of a variety of injection locked resonator-based oscillators may be utilized within ICs as appropriate to the requirements of specific applications in accordance with various embodiments of the invention. A prior art resonator is discussed further below.

Figure 2:
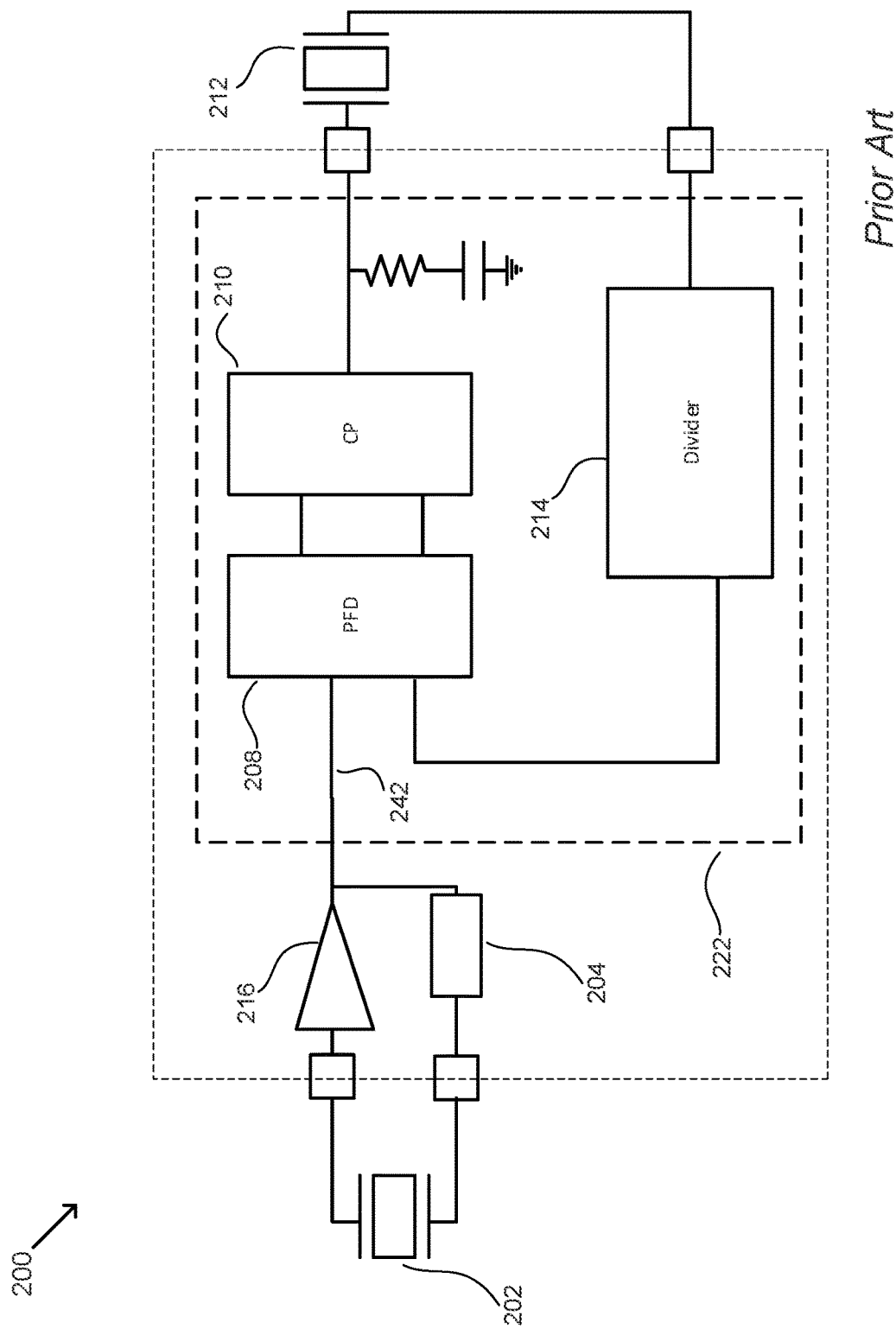
FIG. 2 shows a prior art circuit diagram of a frequency synthesizer using an external high-Q resonator.

Existing electro-mechanical resonators can have multiple modes of operation. A resonator's preferred mode of oscillation can provide for low noise performance of an IC; however, a resonator's unwanted mode of operation may lead the IC to stop functioning properly. This can be due to the fact that a resonator may have multiple modes of resonance at different frequencies, where only one of the modes of resonance can be desirable for proper functioning of an oscillator with the IC. FIG. 2 illustrates a prior art implementation of an oscillator to address this issue.

In a prior art shown in FIG. 2, a circuit diagram 200 of a frequency synthesizer is shown utilizing two resonators, a high frequency resonator which has multiple modes of oscillation, and a low frequency resonator. In the prior art shown in FIG. 2, an off-chip resonator 212 can be connected to an on-chip phase locked loop (PLL) 222 that includes a phase-frequency detector 208, a charge pump 210, and a divider 214. Reference frequency for the PLL 222 can be generated from a low frequency off-chip crystal 202 through an on-chip active circuit consisting of amplifier 216 and feedback circuit 204, where an output signal 242 of the amplifier 216 is fed into the phase-frequency detector 208. In the prior art shown, the off-chip resonator 212 would ideally have voltage sensitivity, however this can lead to higher costs. Furthermore, some off-chip resonators may not exhibit voltage sensitivity, which can cause improper function of the PLL. Moreover, using the off-chip resonator with a PLL may degrade the noise performance of the PLL. Various embodiments of injection locked resonator-based oscillators are disclosed further below.

Figure 3:
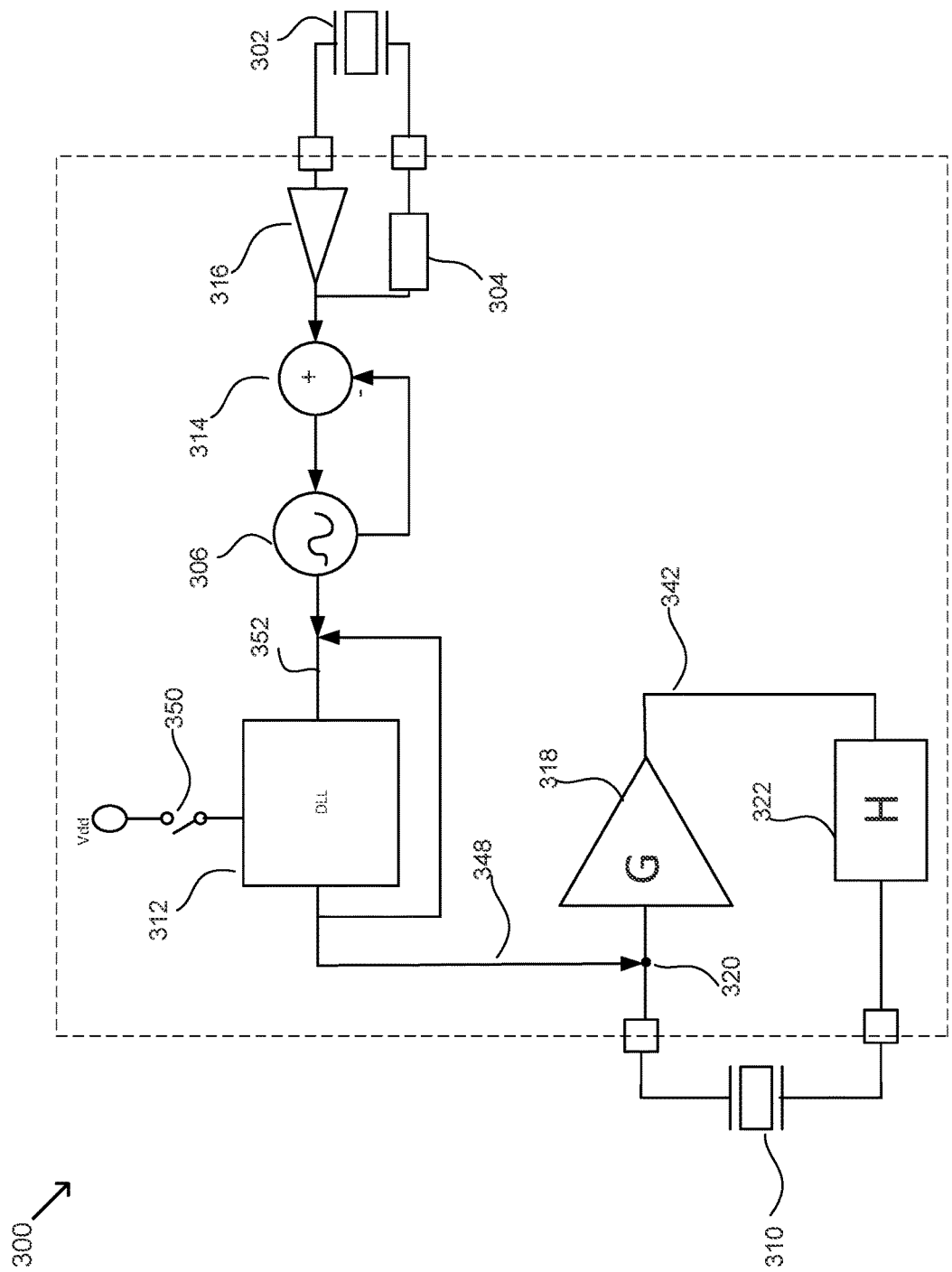
FIG. 3 is a circuit diagram of an injection locked resonator-based oscillator utilizing a low frequency oscillator circuit with a delay locked loop (DLL) to inject a locking signal into a high-Q resonator in accordance with an embodiment of the invention.

In several embodiments, an injection locked resonator-based oscillator can include a delay locked loop (DLL), where the DLL can be turned off once the oscillation of the injection locked resonator-baes oscillator has been locked to a desired frequency. A circuit diagram of an injection locked resonator-based oscillator 300 in accordance with an embodiment of the invention is illustrated in FIG. 3. In the illustrated embodiment, an off-chip high frequency resonator 310 can provide a resonance frequency to amplifier 318, where an output signal 342 of the amplifier 318 can be fed back to the resonator 310 via a feedback circuit 322. In order to lock the frequency of the signal 342 to a desired frequency, another signal 348 can be added at node 320. Signal 348 can be generated by a delay locked loop (DLL) 312 and injected into node 320, where signal 348 can force the output signal 342 to have a desired frequency. DLL 312 can be connected to a power source $V_{dd}$ through a switch 350. Once the output signal 342 has reached a steady state mode of operation and is locked to a desired frequency, the switch 350 can turn DLL 312 off in order to save power. DLL 312's input signal 352 can be generated by utilizing an off-chip low frequency resonator 302, where an amplifier 316 and a feedback circuit 304 can lock the frequency of the resonator 302. The low frequency VCO 306 can use this reference frequency to generate an output clock 352 that is equal to the desired frequency and is fed to a DLL 312 to generate a locked signal 348.

Although various injection locked resonator-based oscillator implementations are described above with reference to FIG. 3, any of a variety of injection locked resonator-based oscillators may be utilized as appropriate to the requirements of specific applications in accordance with various embodiments of the invention. Injection locked resonator-based oscillators that utilize a buffer circuit in accordance with various embodiments of the invention are described further below.

Figure 4:
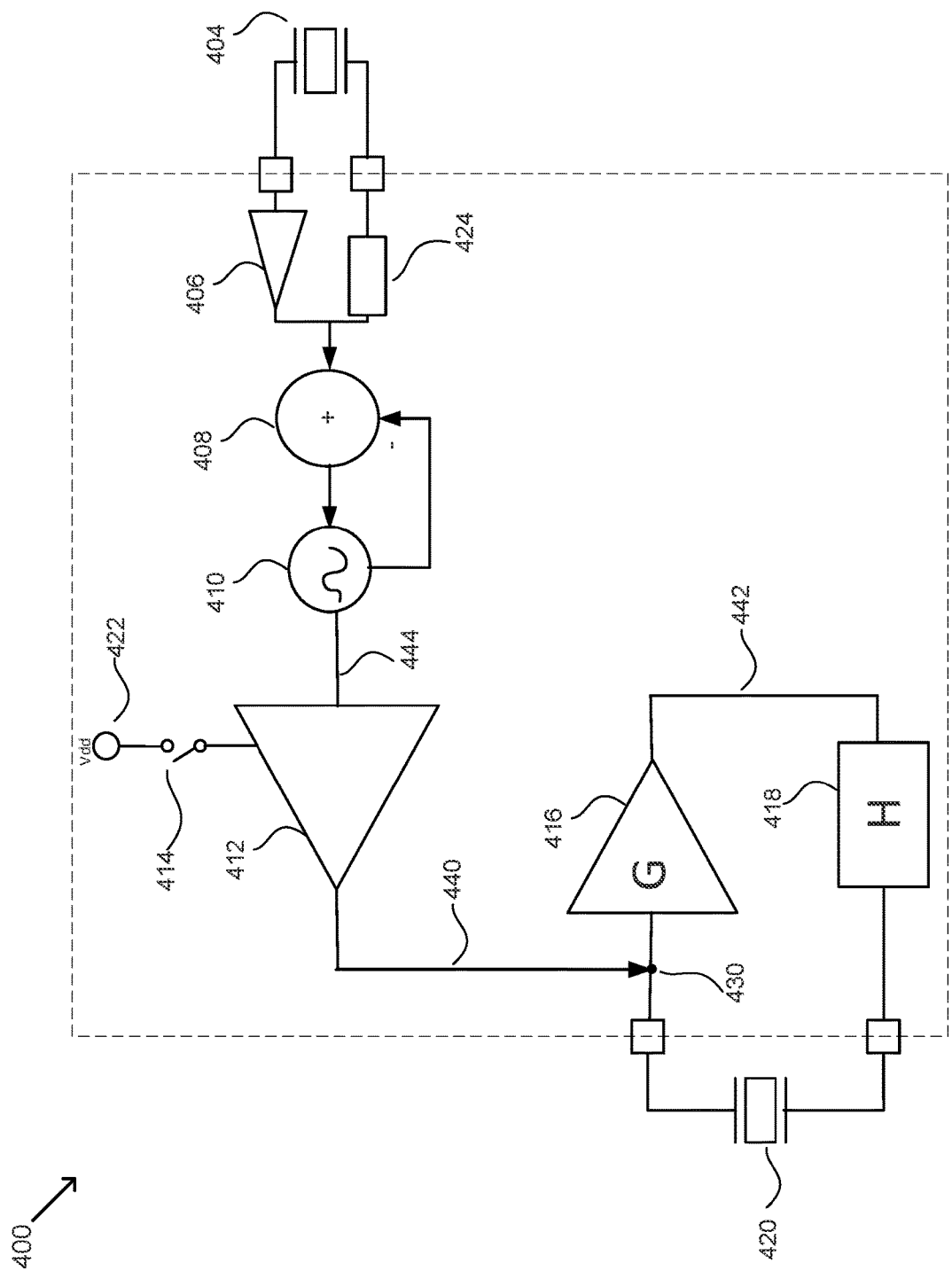
FIG. 4 is a circuit diagram of an injection locked resonator-based oscillator utilizing a low frequency oscillator circuit with a buffer to inject a locking signal into a high-Q resonator in accordance with an embodiment of the invention.

In numerous embodiments, an injection locked resonator-based oscillator can include a buffer circuit, where the buffer circuit can be turned off once the oscillation of the injection locked resonator-based oscillator has been locked to a desired frequency. A circuit diagram of an injection locked resonator-based oscillator 400 in accordance with an embodiment of the invention is illustrated in FIG. 4. In the illustrated embodiment, an off-chip high frequency resonator 420 can provide a resonance frequency to an amplifier 416, where an output signal 442 of the amplifier 416 can be fed back to the resonator 420 via a feedback circuit 418. In order to lock the frequency of the signal 442 to a desired frequency, another signal 440 can be added at node 430. Signal 440 can be generated by a VCO 410 buffered by a buffer circuit 412, and injected into node 430, where signal 440 can force the output signal 442 to have a desired frequency. Buffer circuit 412 can be connected to a power source $V_{dd}$ 422 through a switch 414. Once the output signal 442 has reached a steady state mode of operation and is locked to a desired frequency, the switch 414 can turn off the buffer circuit 412 in order to save power. Buffer circuit 412's input signal 444 can be generated by utilizing an off-chip low frequency resonator 404, where an amplifier 406 and feedback circuit 424 can lock the frequency of the resonator 404. Further, the output signal of amplifier 406 can be fed into an adder 408, where the output of the adder 408 can be fed into a VCO 410. The output signal 444 of the VCO 410 can be fed into an input of the buffer circuit 412 in order to generate a signal 440. The signal 440 can be utilized to generate a locked signal 442.

Although various injection locked resonator-based oscillator implementations are described above with reference to FIG. 4, any of a variety of injection locked resonator-based oscillators may be utilized as appropriate to the requirements of specific applications in accordance with various embodiments of the invention. Injection locked resonator-based oscillators that utilize a divider circuit in accordance with various embodiments of the invention are described further below.

Figure 5:
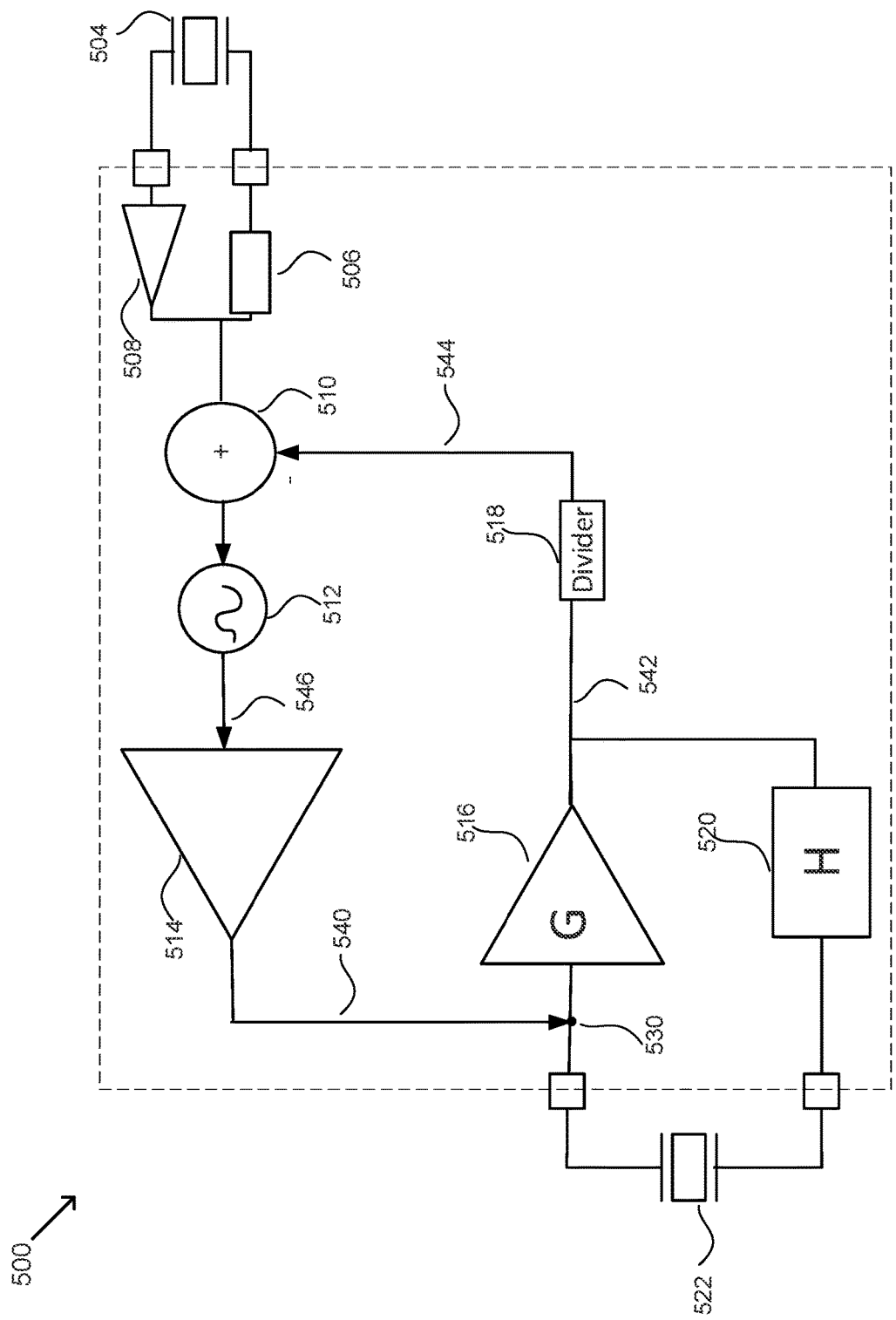
FIG. 5 is a circuit diagram of an injection locked resonator-based oscillator utilizing a low frequency oscillator with a buffer to inject a locking signal into a high-Q resonator and use a divider to tune a voltage-controlled oscillator (VCO) in accordance with an embodiment of the invention.

In various embodiments, an injection locked resonator-based oscillator can include a divider circuit, where the divider circuit can be utilized to provide a feedback signal from an output signal of the injection locked resonator-based oscillator. A circuit diagram of an injection locked resonator-based oscillator 500 in accordance with an embodiment of the invention is illustrated in FIG. 5. In the illustrated embodiment, an off-chip resonator 522 can provide a resonance frequency to amplifier 516, where an output signal 542 of the amplifier 516 can be fed back to the resonator 522 via a feedback circuit 520. In order to lock the frequency of the signal 542 to a desired frequency, another signal 540 can be added at node 530. Signal 540 can be generated by a VCO 512 buffered by a buffer circuit 514, and injected into node 530, where signal 540 can force the output signal 542 to have a desired frequency. Input signal 546 into the buffer circuit 514 can be generated from a low frequency VCO 512, which can get its reference frequency from an off-chip low frequency resonator 504, amplifier 508 and its feedback circuit 506. Low frequency output signal for the injection locked resonator-based oscillator 542 can be divided through a divider circuit 518 to generate signal 544 having a frequency that may be compared with this reference clock (output signal of amplifier 508) in order to complete the loop. In this way, a feedback loop can be formed to force output signal 542 to operate at a desired frequency.

Although various injection locked resonator-based oscillator implementations are described above with reference to FIG. 5, any of a variety of injection locked resonator-based oscillators may be utilized as appropriate to the requirements of specific applications in accordance with various embodiments of the invention.

While the above descriptions and associated figures have depicted injection locked resonator-based oscillators, it should be clear that any of a variety of configurations for a injection locked resonator-based oscillators can be implemented in accordance with embodiments of the invention. More generally, although the present invention has been described in certain specific aspects, many additional modifications and variations would be apparent to those skilled in the art. It is therefore to be understood that the present invention may be practiced otherwise than specifically described. Thus, embodiments of the present invention should be considered in all respects as illustrative and not restrictive.

What is claimed is:

1. An injection locked resonator-based oscillator, comprising:
    an amplifier comprising an input terminal and an output terminal;
    a feedback circuit comprising an input terminal and an output terminal;
    a sub-circuit comprising an input terminal, an output terminal and a terminal;
    an off-chip high-frequency resonator having an output terminal that generates a resonance frequency and an input terminal;
    a switch connected to a power source $V_{dd}$; and
    a voltage-controlled oscillator (VCO);
    wherein the input terminal of the amplifier is connected to the output terminal of the high-frequency resonator and the output terminal of the sub-circuit;
    wherein the output terminal of the amplifier is connected to the input terminal of the feedback circuit;
    wherein the output terminal of the feedback circuit is connected to the input terminal of the high-frequency resonator;
    wherein the input terminal of the sub-circuit is connected to the VCO; and
    wherein the terminal of the sub-circuit is connected to the switch.

2. The injection locked resonator-based oscillator of claim 1, wherein the sub-circuit is a delay locked loop (DLL).

3. The injection locked resonator-based oscillator of claim 1, wherein the sub-circuit is a buffer circuit.

4. The injection locked resonator-based oscillator of claim 1, wherein an output signal output by the output terminal of the sub-circuit is injected with the resonance frequency output by the output terminal of the high-frequency resonator to lock a frequency of the output signal that is output by the output terminal of the amplifier.

5. The injection locked resonator-based oscillator of claim 1, wherein the switch turns the sub-circuit off when the output signal that is output by the output terminal of the amplifier reaches a steady state mode of operation and is locked to a frequency.

6. The injection locked resonator-based oscillator of claim 1, further comprising an off-chip low frequency resonator, wherein an input signal provided to the input terminal of the sub-circuit is generated by the low-frequency resonator.

7. The injection locked resonator-based oscillator of claim 6, wherein the amplifier is a first amplifier and the feedback circuit is a first feedback circuit, wherein the injection locked resonator-based oscillator further comprises a second amplifier and a second feedback circuit, wherein the second amplifier and the second feedback circuit lock a frequency of the low-frequency resonator.

8. The injection locked resonator-based oscillator of claim 7, further comprising an adder, wherein an output signal from an output terminal of the second amplifier is fed to the adder and an output of the adder is fed to an input terminal of the VCO.

9. The injection locked resonator-based oscillator of claim 7, wherein the VCO uses the frequency of the low-frequency resonator to generate an output clock that is equal to a desired frequency that is fed to the input terminal of the sub-circuit to generate a locked output signal output by the output terminal of the sub-circuit.

10. The injection locked resonator-based oscillator of claim 7, further comprising a divider circuit, wherein the output signal from the output terminal of the first amplifier is divided through the divider circuit to generate a signal that is compared with the output signal from the output terminal of the second amplifier to form a feedback loop.

11. A method for injection locking frequency of oscillation, comprising:
    generating, using a high frequency resonator comprising an output terminal and an input terminal, a resonance frequency signal on the output terminal and providing it to an input terminal of an amplifier;
    injecting, using a sub-circuit comprising an input terminal, an output terminal, and terminal, a signal that is output from the output terminal of the sub-circuit to the input terminal of the amplifier; and
    generating an output signal on an output terminal of the amplifier and feeding the output signal back to the input terminal of the high frequency resonator using a feedback circuit;
    wherein the input terminal of the sub-circuit is connected to a voltage-controlled oscillator (VCO) and the terminal of the sub-circuit is connected to a switch that is connected to a power source $V_{dd}$.

12. The method of claim 11, wherein the sub-circuit is a delay locked loop (DLL).

13. The method of claim 11, wherein the sub-circuit is a buffer circuit.

14. The method of claim 11, wherein an output signal output by the output terminal of the sub-circuit is injected with the resonance frequency output by the output terminal of the high-frequency resonator to lock a frequency of an output signal that is output by the output terminal of the amplifier.

15. The method of claim 11, wherein the switch turns the sub-circuit off when the output signal that is output by the output terminal of the amplifier reaches a steady state mode of operation and is locked to a frequency.

16. The method of claim 11, further comprising generating, using a low-frequency resonator, a signal and providing the signal to the input terminal of the sub-circuit.

17. The method of claim 16, wherein the amplifier is a first amplifier and the feedback circuit is a first feedback circuit, wherein the method further comprises locking a frequency of the low-frequency resonator using a second amplifier and a second feedback circuit.

18. The method of claim 17, wherein an output signal from an output terminal of the second amplifier is fed to an adder and an output of the adder is fed to the VCO.

19. The method of claim 17, wherein the VCO uses the frequency of the low-frequency resonator to generate an output clock that is equal to a desired frequency that is fed to the input terminal of the sub-circuit to generate a locked output signal output by the output terminal of the sub-circuit.

20. The method of 17, wherein an output signal from the output terminal of the first amplifier is divided through a divider circuit to generate a signal that is compared with an output signal from an output terminal of the second amplifier to form a feedback loop.

* * * * *